United States Patent [19]
McCall

[11] Patent Number: 5,343,490
[45] Date of Patent: Aug. 30, 1994

[54] WHISPERING MODE MICRO-RESONATOR

[75] Inventor: Samuel L. McCall, Chatham, N.J.

[73] Assignee: AT&T Bell Laboratories, Murray Hill, N.J.

[21] Appl. No.: 943,943

[22] Filed: Sep. 11, 1992

Related U.S. Application Data

[63] Continuation-in-part of Ser. No. 761,207, Sep. 17, 1991, abandoned.

[51] Int. Cl.⁵ .............................................. H01S 3/05
[52] U.S. Cl. ...................................... 372/94; 372/43; 372/67; 372/92
[58] Field of Search ............... 372/94, 92, 43, 44, 372/45, 50, 66, 67

[56] References Cited

U.S. PATENT DOCUMENTS 4,829,537  5/1989  Baer ........................................ 372/92
5,197,071  3/1993  Yamada .................................. 372/94

OTHER PUBLICATIONS

I. Ury et al, "Whispering gallery lasers on semi–insulating GaAs substrates", Appl. Phys. Lett. 36 (8), Apr. 15, 1980, pp. 629–631.

"The Problem of the Whispering Gallery," *Scientific Papers*, v. 5, pp. 617–620, Cambridge University, Cambridge, England (1912). (no month).

T. Krauss, et al, *Electronic Letters*, v. 26, pp. 2095–2097 (Dec. 6, 1990).

*Primary Examiner*—James W. Davie
*Attorney, Agent, or Firm*—George S. Indig

[57] ABSTRACT

Device for electromagnetic emission depends on total internal reflection-on whispering gallery mode cavitation about the periphery of a disk-shaped element of sub-wavelength thickness. As a laser, operating above threshold, the design is alternative to that of the Surface Emitting Laser for integration in integrated circuitry-either all-optic or electro-optic. Operating below threshold, it may serve as a Light Emitting Diode. The same operational considerations-based on improved efficacy for whispering gallery mode devices as due to relevant dimension/s of sub-wavelength thickness-is of consequence for a category of devices serving other than as simple emitters. Such three port devices may serve as switches, modulators, etc.

27 Claims, 5 Drawing Sheets

WHISPERING MODE MICRO-RESONATOR

This application is a continuation-in-part of co-pending application, Ser. No. 07/761207, filed Sep. 17, 1991, now abandoned.

BACKGROUND OF THE INVENTION

1. Technical Field

A micro-resonator structure depends upon cavitation of whispering mode energy regardable as defining cavitation about the perimeter of a sub-wavelength thick active region of various configurations. Operating in the lasing mode, it offers an alternative to the Surface Emitting Laser for incorporation in integrated circuitry—either all-optic or electro-optic.

2. Description of the Prior Art

A general category of structures includes optical detectors as well as a variety of two port and three port devices providing for modification either of output or input. Worldwide activity is consistent with the consensus that the SEL offers promise of satisfaction of the longstanding desire for large-scale incorporation of active photonic devices in integrated circuits. Hope is based on the very low lasing threshold values which intrinsically reduce heating, usually $I^2R$ heating losses attendant on pumping considered central to frustration of this desire.

Development of the SEL has entailed a number of design advances. Use of bulk active material has, to significant extent, yielded to quantum well structures—including the ultimate single quantum well structure. Process variations have involved deposition techniques with a view both to compositional uniformity and dimensional regularity. An area of considerable consequence has involved the sandwiching Distributed Bragg Reflector mirrors. Reported operating devices dependably achieve reflectivities of 99+% as yielded by $\approx$20–40 pair DBRs for 0.8–1.1 $\mu$m wavelength emission. This latter consideration—definition of the laser cavity in terms of DBRs—has been of primary consequence in evolution of the SEL. Achievement of excellent reported reflectivities is ascribed to satisfaction of very tight fabrication tolerances.

On the other side of the ledger, achievement of each new SEL design has depended critically on the DBR to, in turn, result in considerable expense as well as some undesirable operational consequence. DBRs, as the name connotes, is distributed-significantly increases modal volume beyond that of the responsible active region. In the instance of a Single Quantum Well structure designed for operation at 1.3 $\mu$m, this consideration results in an increase of 20$\times$.

SUMMARY OF THE INVENTION

At the same time, desired population density in the optical or hybrid device gives rise to need for a variety of passive as well as other types of active devices. A design approach alternative to the SEL depends upon cavitation of energy in the form of "whispering gallery modes" as supported within a thin element—an active material element of thickness characteristically of a maximum of a half wavelength (with the wavelength value as measured in bulk material) over some substantial portion of the functioning element. Cavitating energy is generally largely confined to a peripheral portion of the element which latter may be of a variety of configurations, generally of maximum dimension of the order of microns to accommodate integration size desire.

An important category of devices in accordance with the invention, provides for attainment of lasing threshold. The generic concept of the whispering mode micro-resonator is usefully applied as well to structures which designedly, or through operation, do not reach threshold. Resulting Light Emitting Diodes may serve many of the purposes of lasers with advantages in practical terms of e.g. yield, power requirements, etc. One contemplated use is as a switched element, in which functioning depends simply upon presence or absence of output, and not, e.g. on coherence.

Design variations with attention to critical dimensions and other parameters are discussed under "Detailed Description". In general terms, operation depends upon cavitation as involving three or more reflecting positions (as distinguished from usual two-mirror cavities). Requirement for "total internal reflection" in usual contemplated devices—devices of micron/s dimensions—for usually/practically available index contrast generally results in polygonal cavity path of four or more sides.

It is believed that the invention meets a need for replacement of purely electronic IC circuitry. It offers low power consumption for constituent devices in photonic as well as optoelectronic circuits. In-plane as well as out-of-plane, light generation, in devices of micron size dimensions, permits the many inherent advantages of optical circuitry consistent with size and economic requirements.

At the same time, the efficacy of whispering gallery mode operation, as afforded by fractional wavelength, $\lambda$, dimension, translates into a variety of optical devices which, together with simple laser and LED emitters, permit design of optical IC's serving the range of functions associated with traditional electronic IC's. Such devices include simple detectors dependent on effective cavitation to improve sensitivity. Other device functions include switching, amplification, wavelength adjustment and variation, etc. Some such devices may introduce control signals via a third port or may use one of the basic input or output ports, e.g. to change cavity Q. The purpose includes amplitude change for a particular wavelength being cavitated, as well as to shift wavelength either regarding detection or output.

BRIEF DESCRIPTION OF THE DRAWING

FIG. 3 is a perspective view of an octagonal structure,

FIG. 4 is a perspective view of a disk structure in which the peripheral region, within which whispering gallery mode energy is propagated, encloses a relatively thin membrane, a membrane of mechanical or performance consequence, FIG. 5 is a perspective view, partly in cross-section, of a donut-shaped cavity again including a membrane, of performance characteristics related to those of FIG. 4 and FIG. 6 is a perspective view, partly in cross-section, of a structure alternative to that of FIGS. 4 and 5 in which modal action is within a peripheral path now of triangular section.

FIG. 10 for electrodes straddling the active element and

FIG. 11 for spaced electrodes on a single element surface.

DETAILED DESCRIPTION

Definition of Terms

Figure 1:
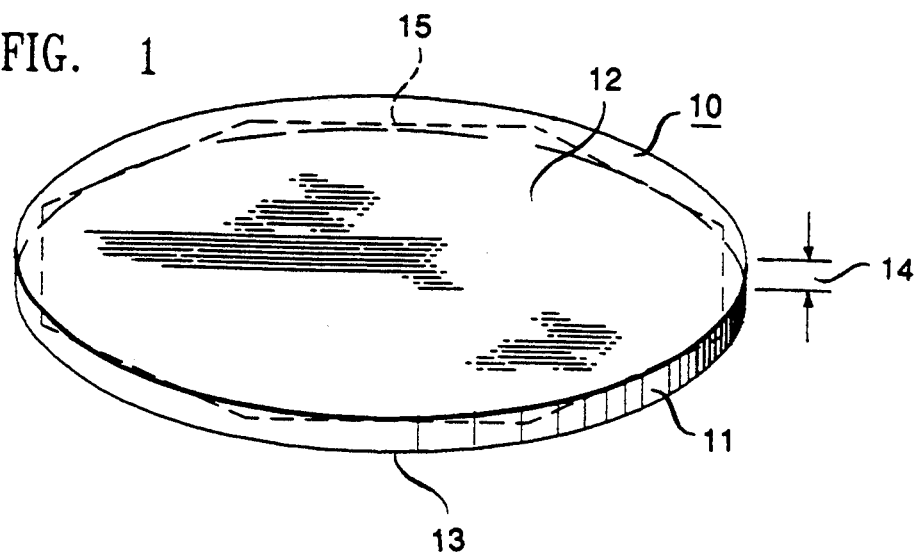
FIG. 1 is a perspective view of the prototypical disk-shaped structure, usefully employed for tutorial purposes, and also of practical significance.

While term meaning and context will be familiar to experts in the field, likelihood of study by those of lesser expertise as well as on-going development justify this section.

Disk—this is the active region, or active region-containing portion of the structure responsible for electromagnetic emission, always of some degree of coherence as regards emitting devices—"emitters" as here defined. While for tutorial purposes this term is generally considered as of circular configuration as defined between parallel surfaces of unvarying spacing, the term is intended to have a more generic meaning. In the generic sense, "disk" defines structures in which preponderant cavitating energy is due to total internal reflection largely within such region/s. It is convenient to refer to the disk as defining a symmetrical structure, e.g. a circular structure. As long as the fundamental requirement for total internal reflection is satisfied, the shape of the disk may be asymmetrical—in fact, providing for an oval structure may be advantageous in terms of coupling either input or output. In any event, a dimension (usually the "thickness" dimension) perpendicular to cavitation direction is but a fraction of a wavelength. This fraction, ordinarily $\leq 0.5\lambda$, and in a category of preferred structures $\simeq 0.25\lambda$, is based on wavelength measurement within the structure—taking into account both bulk refractive index and variations introduced by small structural dimensions. The subscript, eff, has reference to effective value so that $n_{eff}$ is a measure of the refractive index taking both factors into account.

Mode—in terms of device design it is not grossly inaccurate to regard preferred structures as being generally of single-mode operation. While this is strictly true only for varying thickness devices—with thickness varying radially—such as in the structure of FIG. 4, it continues to be approximately true for other contemplated structures. In detailed terms, there is many-mode operation for many structures. Mode multiplication takes the form of radially dependent modes, N, as well as of varying peripheral modes, M or alternatively $M_1$. As described elsewhere, $M_1$ defines the number of sides in the polygonal path of cavitating emission energy. The more general mode number, M, defines the number of undulations in the mode path without reference to the number of polygonal path sides. (An undulation is considered as corresponding with a full sinusoidal wave.)

Modal path—this contemplates the description immediately above. Polygonal sides in many circumstances consist of a single full wave (so that $M=M_1$). Operating structures, however, may depend upon modal paths in which $M=M_1$—in which there are multiple full waves, or under certain circumstances, but a half wave per side.

Penetrating field—fields which penetrate from the active region into the surrounding medium. These are the fields which offer both facility for coupling into other elements of the circuit (either through perfect structure or through discontinuity—e.g., the grooved surface of FIG. 8) but at the same time are susceptible to unintended coupling to result in possible loss.

Whispering gallery mode/whispering mode—this terminology, familiar to those concerned with internally reflecting spherical as well as cylindrical structures, defines the form of cavitation responsible—usually in whole responsible—for operation of devices of the invention. Described in somewhat greater detail further on, the operation depends upon internal reflection as resulting from incidence of cavitating energy on a peripheral structure at an angle $\leq$ the "critical angle".

Quantum well—it is generally understood this term refers to deviation from the hypothetical sphere defining the effective region of an exciton—within an effectively limitless medium of constant refractive index. For purposes of this description—for purposes meaningful in terms of device design—the critical dimension of a quantum well must be at least 10% shorter than the diameter of such hypothetical sphere.

Emitter—device of the invention in which functioning relies on simple emission, i.e. on presence of optical output.

Three Port Device—a device providing for three or more couplings with the disk—such couplings providing for at least two inputs and one output. Contemplated inputs accommodate pump energy and modulating signal. The output provided for is modulated in accordance with modulating signal/s. While three port devices may include three position-identifiable couplings, a single physical port may designedly be used for both of the inputs. Such a device is here defined as "three port" and is to be distinguished from "two port" devices in accordance with the following definition.

Two Port Device—a device providing for two couplings only—for a single input and a single output. "Two port" devices are, accordingly, intended to be descriptive of an "emitter". It is intended to be generic, as well, in contemplating a "modulated output"—an output providing for some intelligence-bearing variation such as, directional change, phase change, amplitude change, as well as simple presence and absence of output (in which presence, absence, interval of on or off is intelligence bearing), etc. Such a modulated output is as contemplated for a three port device, the difference being that the sole input is an already "modulated" input. The latter form of two port device makes use of the effective cavitation provided for by the invention in the direct cavitation of input. An example of the latter is a cavity enhanced detector.

General

The inventive class of micro-resonator structures present a large index contrast—a large change in refractive index for optical energy of wavelengths of operational consequence—as between a functional, optically thin semiconductor layer (the "active" region) and relatively low index surrounding medium. Structures depend upon mode cavitation similar to whispering gallery modes as described, for example, by Lord Rayleigh, "The Problem of the Whispering Gallery", *Scientific Papers*, Cambridge University, Cambridge, England, vol. 5, pp. 617–620 (1912) and T. Krauss, et al, *Electronics Letters*, vol. 26, p. 2097 (1990). Dependence upon critical angle internal reflection results in high reflectivity without the bulk and increase in modal volume associated with DBR mirrors. Fundamental requirements for "total" internal reflection are well known and are not discussed in detail. In general, the phenomenon as well as the precise angle value are set forth in texts. Basically, the requirement that the wave-vector components parallel to the interface must be equal across the boundary of required index contrast results in total internal reflection for incident angles larger than $\sin^{-1}(1/n_{eff})$. Deviation is invariably in the direction of other losses which, while generally of little consequence, dictate lesser angle values to the extent feasible. Generally, it is found that such loss, as critical angle is approached, is characteristically at a value of perhaps 0.1%. A particular configuration providing for an octagonal cavitation path within a smooth circular disk results in loss of approximately one part in $10^6$.

Operational advantages which are discussed in terms of emitters—largely lasers—are of the same value for other devices of the invention.

Until now, emphasis has been on emitters of the invention. The same structural approach, in providing for a thickness, or other dimension orthogonal to propagating energy—providing for such a cavity dimension—improves operation for a variety of devices relative to "bulk operation". (This term is here defined as operation in which all cavity dimensions are equal to or larger than one wavelength of the propagating energy—one wavelength as measured within the medium and as influenced by future spacing and other characteristics of the device.)

A contemplated category of three port devices takes the form of microresonators in which output variation—e.g. in direction, in amplitude, in wavelength, or simply in "on-off operation"—is the consequence of a controlling input—of a "signal input". Resulting nonlinear optical response is the consequence of Q change or of resonant frequency. Such operation is conveniently considered as analogous to the traditional electronic triode transistor. Since modulation, in most instances is due simply to change in refractive index for a single cavity to which both input and output are intimately attached, the signal may be introduced at the pump or output position.

Figure 10:
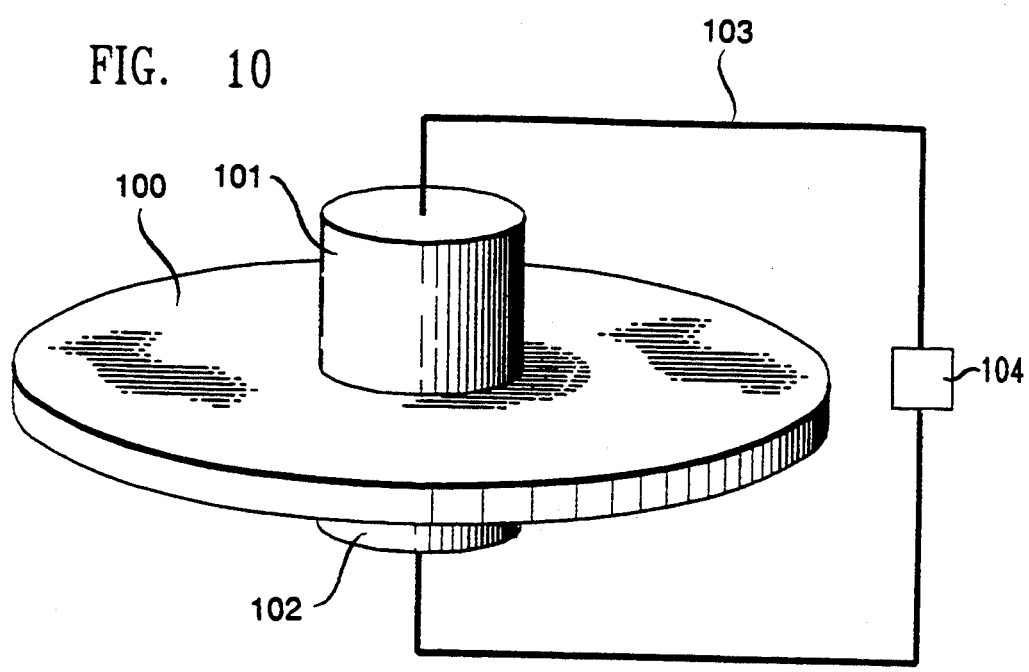
FIGS. 10 and 11 are perspective views depicting two device arrangements including electrodes for pumping, for signal input or signal output.
Figure 11:
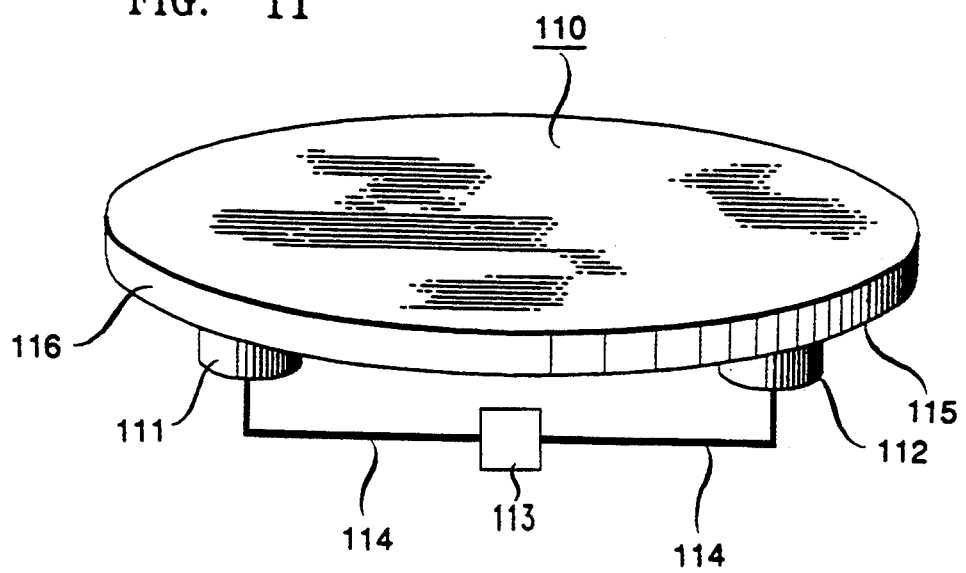

For the most part the invention is conveniently discussed in terms of output which is optical, and which is otherwise of the character of the cavitating energy, e.g. of the same wavelength, phase, etc. In a very real sense, such output is, in fact, an extracted portion of the cavitating energy. While all contemplated devices provide for such extraction, there is an important category of devices in which such extracted energy does not, itself, serve as output. Example 4 is such an instance. Structures, for example, as shown in FIGS. 10 and 11 may provide for electrical output. Detectors and other forms of devices may convert such extracted optical (cavitating) energy into electrical form as there discussed. Conversion may take other forms. Optical output may conveniently be of some wavelength other than that of the cavitating energy, e.g. to better interface with subsequent elements, etc. Output, regardless of energy form, may be modulated or unmodulated. While likely optical—of wavelength, phase, and of other characteristics of the cavitating energy—it may take other form, e.g., electronic. The pump, if present, as always, serves to provide gain. Its output may take a variety of energy forms—of suitable optical or electronic form. As indicated, two port devices may provide for modulated output, but no gain. Two port devices may operate on the basis of coherent, as well as of information-bearing input. Such operation, in which no provision is made for gain, may literally take the form of a three port device in which two or more signals influence the output.

The modulating—or controlling—input may cause changes which alter the cavity resonance frequency or its Q value. One form of device using this phenomenon may cancel the unmodulated output, e.g. by means of delicate destructive phase interference. Such cancellation may, in other instances, represent absence of (modulation) input so as to upset the balance to, in turn, result in "on" responsive to presence of such input.

In basic terms the inventive advance depends upon the sensitivity of the internally reflecting cavity as constructed from critically-dimensioned sub-wavelength material. Small energy loss is the consequence of discussed characteristics—e.g. essential elimination of higher modes as well as characteristics associated with whispering gallery mode operation—e.g. essentially lossless reflection (as contrasted with losses associated with DBRs). In general, three port devices, as well as other devices of the invention, may otherwise function in the fashion of prior art devices. For example, a bistable optical device may be switched by means of a light pulse introduced into the cavity through a third port. Similarly, output characteristic—e.g. amplitude—may be controlled by such input. There are many such examples.

The drawing is in general terms as designed to serve as basis for the improved cavity of the invention. It is not designed to explicitly serve as discussion of any of the many possible device functions—two port or three port. Any of the structures described in the figures may serve many such functions.

Microstructures of the invention, while usefully employed as discrete devices, are of primary interest for their value in integrated circuitry. In particular, operating as lasers, permitted low power operation satisfies desire for low threshold consistent with small heat loss. Contribution to this operating desire is advanced by permitted effective matching between small gain volume and single optical mode—generally the first TE mode. Optical gain for disk modes is provided by one or more optically pumped quantum wells in the plane of the disk. Generally, active region thickness—for single quantum well structures, disk thickness—is less than $\lambda/2n_{eff} \approx 2,000$ Å for $\lambda = 1.5$ μm and $n_{eff} = 3.5$. Structures are desirably characterized by high index contrast as between the disk and the surrounding medium, in particular, as concerns the disk region of greatest modal energy concentration. This contrast is generally defined as between active material—in accordance with usual structures defined as including active layer/s together with encompassing spacer/barrier layers. Surrounding media for structures described may be space—e.g., vacuum or air—or some, likely passive, low index medium such as amorphous silica, $SiO_2$. The illustrative values set forth translate into an index contrast (or index ratio) $n_{eff}/n_o$ where $n_o$ equals index of the surrounding medium. Index contrast of this order of magnitude or greater is attainable for likely operating wavelengths which are less than 1.5 μm. Other considerations having to do e.g., with ease of fabrication, may dictate lesser contrast values. While the teachings of the invention may be implemented by appropriate variation in such design considerations as disk radius, other considerations such as desire for small size for convenient integration, as well as fabrication ease, all suggest values of contrast of a minimum of 1.3 or preferably greater, e.g., greater than 1.5. This high index contrast coupled with sub-λ thickness dimension effectively confines the active optical mode/s and is a key feature in assuring effective overlap with the gain layer (i.e., with the active region—generally the quantum well active region).

Figure 7:
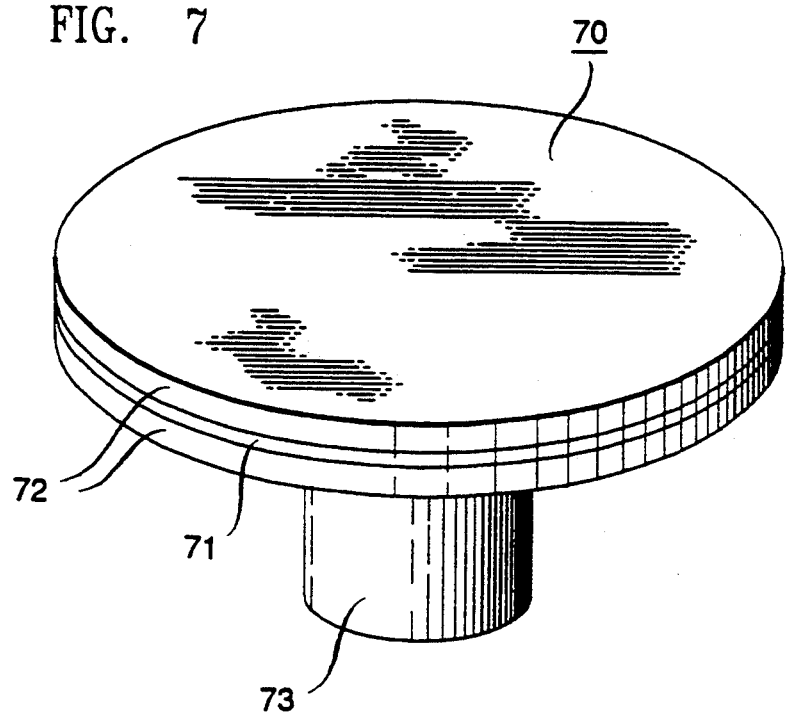
FIG. 7 is a perspective view of a representative structure—of a structure used in some of the examples herein—in which the disk-shaped element is supported upon a pedestal, e.g. as shaped by etching of the growth substrate.

FIG. 7 depicts one form of structure designed with a view to the above considerations. It provides for a disk 70 consisting of active region 71 sandwiched between spacer layers 72 and supported upon cylindrical pedestal 73 as fabricated from material initially serving as an epitaxial growth substrate, for example, in accordance with a procedure outlined below.

Fabrication

The device of FIG. 7, as used in Example 1, was fashioned from epitaxially-grown InP/InGaAsP layered material. One such device consisted of a 100 Å thick quantum well layer 71 of InGaAs sandwiched between 200 Å thick barrier layers 72 of InGaAsP to result in a total disk 70 thickness of 500 Å. In other work, use was made of a 1500 Å disk consisting of 6 such 100 Å active layers as separated by barrier material. Initial growth was on an InP substrate part of which was retained upon etching to result in pedestal 73. Photolithographic techniques were used to pattern disks with diameters of 3 μm, 5 μm and 10 μm. An HCl solution was used to selectively etch substrate material while leaving the functional InGaAs/InGaAsP disk unetched.

In a working example the InP pedestal 73 retains a rhombus shape cross section as due to the anisotropic nature of the HCl etchant. One such pedestal was approximately 1 μm in diameter and 2 μm in height, so leaving a peripheral region of radial dimension ≃1 μm within which index contrast is defined as between disk 70 and ambient—in the instance of Example 1, of ambient air. In another working example, such a structure was encapsulated in 0.5 μm of $SiO_2$ deposited by Chemical Vapor Deposition.

EXAMPLE 1

A microdisk as described above, of diameter 5 μm, is optically pumped with a HeNe laser operating at λ=0.63 while cooling with liquid nitrogen. The spectrum for the single quantum well structure lases at a center wavelength of 1.3 μm with a spectral linewidth of <1 Å. The 1.3 μm laser spike rises above the broad photoluminescent background by a factor approaching 10×.

The threshold value for the structure of Example 1 is below 200 μW. Since the disk 70 has a volume of the order of $10^{-12} cm^{-3}$, the pump power of the order of 1 milliwatt is equivalent to a power density in the disk which approaches $10^9$ watts $cm^{-3}$. Heat sinking for the structure depicted in FIG. 7 is sufficient to prevent destructive temperature rise.

EXAMPLE 2

The procedure of Example 1 is carried out for a 5 μm diameter disk of thickness of 1500 Å containing 6 quantum wells. Measured output laser power approaches 1 μw for a pump power slightly below 500 μW. The spike intensity as coupled out vertically is more than 100× greater than the background photoluminescence.

Micro-cavity design, depends, inter alia, on active region film thickness approximating one-quarter wavelength, $\lambda_b$ (as measured in bulk material)—which may be increased to greater, still sub-λ thickness to increase figure of merit accounting for imperfections defining departure from the hypothetical device. High reflectivity and sub-λ thickness results in good matching efficiency between small gain volume and single optical mode to result in low power requirement, e.g., in low laser threshold. High index contrast reduces loss associated with penetrating field, and enhances mode selectivity. Designation of operating modes is yielded by solution of Maxwell's equations (see, for example, J. D. Jackson, "Classical Electrodynamics", John Wiley & Sons, New York (1975)). Importantly, functional layers less than $\lambda/2 n_{eff}$, in which $n_{eff}$ is the effective refractive index for electromagnetic wave energy at the device operational wavelength, λ as measured in vacuum, support only the lowest order TE and TM guided waves. For thickness value of approximately $\lambda/4 n_{eff}$, coupling to the TE mode dominates to such extent that interactions with TM waves as well as all unguided waves may be disregarded.

EXAMPLE 3

Figure 5:
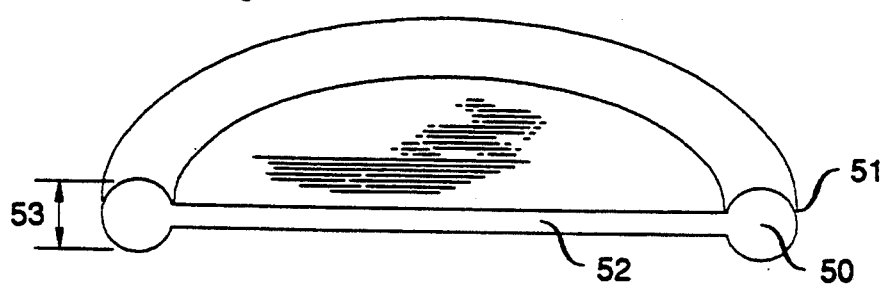

A six quantum well structure similar to that of Example 2, of the form shown in FIG. 11—5 μm diameter, 1500 Å thick—is operated as an electrically pumped laser. Coupling of output is by means of a light guide of shape and spacing as diagrammatically shown in FIG. 9. The guide is of 800 μm in length and 4 μm in width—the same guide used for coupling input energy to be detected in Example 4. Drive energy as applied across the spaced electrodes, consists of 1 milliampere pulses of 200 psec duration and 10 μsec spacing to result in a repetition rate of $10^5$/sec. Laser emission, as coupled into the light guide, is of 1.5 μm vacuum wavelength.

EXAMPLE 4

A structure as used in Example 3—six quantum well, 5 μm diameter, 1500 Å thickness—arranged in the configuration of FIG. 11 is operated as a two-port detector—as a cavity-enhanced detector. For purposes of the Example, element 113 is a simple current meter. Input optical energy is coupled in by means of a light guide of the configuration of element 91 of FIG. 9. The dielectric light guide is 800 μm in length and 4 μm in width. Pulses of nominal wavelength 1.5 μm (always as measured in vacuum) of approximately 200 psec as delivered from the laser operated in accordance with Example 3, serve as signal to be detected. Output signal consists of current pulses approximately 0.4 microampere of duration of 175 psec.

EXAMPLE 5

A disk of the dimensions and otherwise of the character described in Example 4 is operated as a three-port, all-optical device. Provision is made for a first optical input by coupling with a dielectric light guide as described in Example 4. Light output is by means of a second guide of the same dimensions and character. Provision is made for a second optical input by means of a laser beam made incident on the broad upper face of the disk. Operation—device function—may take any of several forms. In one form, light entering by means of the first optical input is only seen at the output when the disk is pumped by laser light entering by means of the second input. In a second form of operation, the disk structure is brought just shy of lasing threshold by means of light entering by means of the second input. Light is seen at the output only upon light introduction by means of the first input. In this form of operation the device may be considered as a gated amplifier.

A disk of the dimensions and otherwise of the character described in Example 4 is operated as a three-port, all-optical device. Provision is made for a first optical input by coupling with a dielectric light guide as described in Example 4. Light output is by means of a second guide of the same dimensions and character. Provision is made for a second optical input by means of a laser beam made incident on the broad upper face of the disk. Operation—device function—may take any of several forms. In one form, light entering by means of the first optical input is seen at the output when the disk is pumped by laser light entering by means of the second input. In a second form of operation, the disk structure is brought just shy of lasing threshold by means of light entering by means of the second input. Lasing threshold is attained upon light introduction by means of the first input. In this form of operation the device may be considered as a gated amplifier.

Active Region—Configuration, Dimensions

Reference is made to FIGS. 1 through 6 in this section.

A cautionary note—it is convenient to discuss devices in terms of ray optics (in terms of particles rather than of more complex but accurate wave energy). "Critical angles" for "total internal reflection", as well as cavitation paths defined in terms of bounce points are usefully employed. Inaccuracies so introduced are of particular consequence for the involved dimensions—of the order of whole and fractional wavelengths.

The polygonal path, simplistically representing the mode path, is generally discussed here in terms of $M_1$, the "mode number" corresponding with the number of sides of the polygon. The more general mode number, M, corresponds with the number of undulations or oscillations in the mode path without reference to number of "bounces". (So, for example, a four-sided polygon—$M_1=4$—may correspond with a path of a total of 8 undulations or one wave per side.)

FIGS. 1 through 6 are generally illustrative of a larger variety of configurations.

FIG. 1 depicts a disk 10, having a smooth continuous curved edge 11, in this instance defining a circle. The figure is intended as representative of a subset of configurations defined by parallel planar surfaces e.g., surfaces 12 and 13, at least over some relevant region of the device, with such planar surfaces being separated by the critical sub-wavelength dimension 14, e.g. the usually preferred $\approx \frac{1}{4}$ wavelength discussed. This subset is of lateral configuration which may be circular as well as elliptical or irregular shape. Dimensions and operating conditions are such as to result in cavitation defining octagonal path 15 ($M_1=8$).

Figure 2:
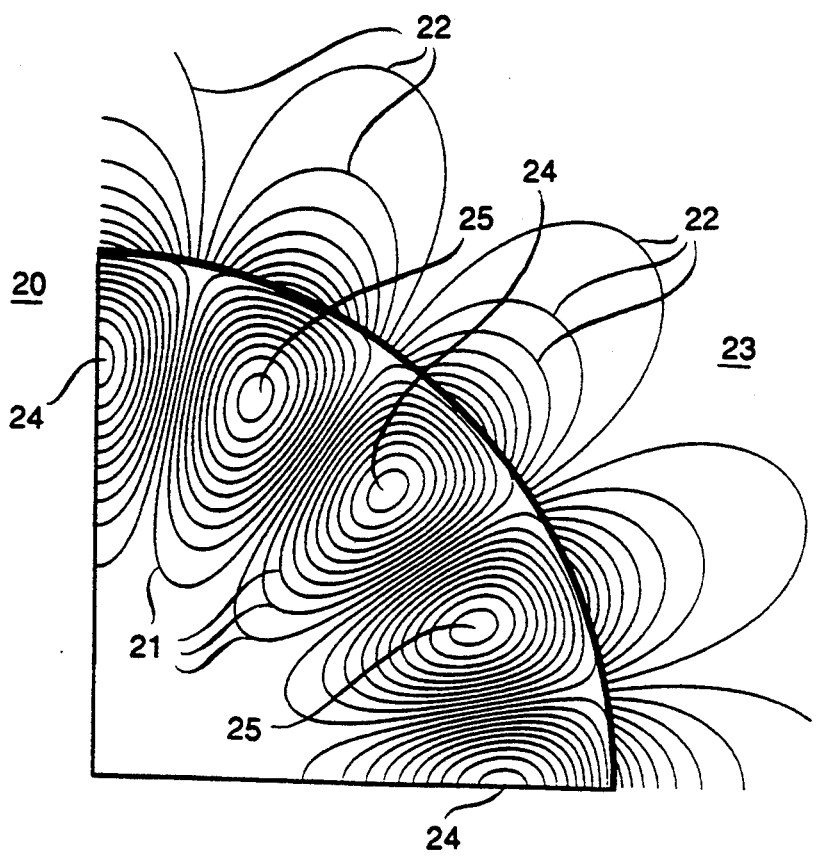
FIG. 2 is a diagrammatic view of a quadrant of a round disk structure in accordance with FIG. 1 with representation of internal and penetrating field lines for one particular mode of operation.

FIG. 2 is a contour map including a quadrant of disk 20, representing positions of constant electromagnetic field lines 21, for such values within disk 20 and lines 22 for such values relating to penetrating field within region 23 external to the disk. As depicted, maximum positive field values are positioned at hillocks or peaks 24 and maximum negative field values are positioned at depressions 25. Accordingly, FIG. 2 is representative of two undulations per quadrant, or eight undulations for the entire disk, so corresponding with an octagonal modal path such as path 15 of FIG. 1 in which each side of the path is made up of one full wave. Field portions represented by contour lines 22, in representing field penetrating to external region 23, are potential coupling areas but represent potential loss as well, e.g. as due to surface roughness-scattering as well as unintended coupling.

Figure 3:
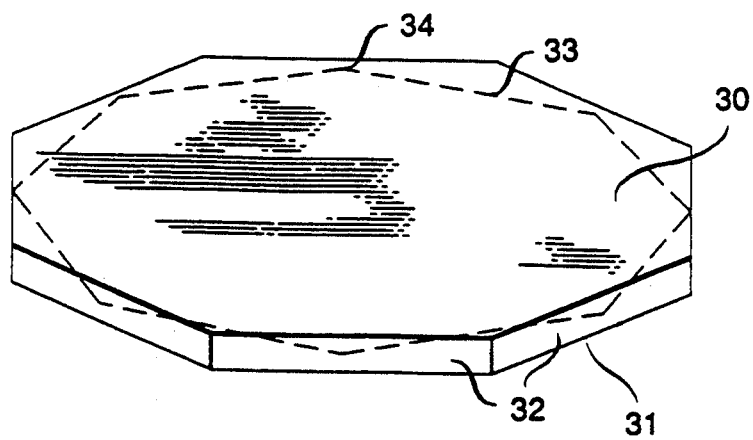
FIGS. 3 through 6 are representations of some of the structures alternative to a simple planar disk.

FIG. 3 is representative of a subset of configurations again defined by parallel planar surfaces 30, 31 of critical spacing as discussed, e.g. with regard to appropriate mode selection but, in this instance, defined by a perimeter constituted of equal length flat faces 32. As in other figures, the configuration shown is intended as representative of a larger class—e.g., as constituted by polygons, irregular as well as regular, of lesser or greater number of sides Modal path 33, shown as a broken line, is depicted as octagonal and, to first approximation, is equivalent to modal path 15 defined within a circular version of disk 10 of FIG. 1. Operationally, such a path 33 as defined within a disk connecting positions 34 is equivalent to modal path 12 but for second order variations, e.g. with regard to loss or other implication of variation in magnitude of penetrating field as related to the lateral thickness of material encompassing path 33 particularly in proximity at positions 34. Representation is meant to include irregular as well as regular shapes so that, in this instance, sides 32 may be unequal in lateral dimension always providing for a predominant polygonal modal path, which while possibly of differing numbers of undulations for different path lines, is so designed as to maximize desired coupling and to minimize undesired coupling. An irregular polygonal shape may, for example, serve to accommodate an arrangement such as that of FIG. 11—to provide for an irregular path of more nearly constant coupling independence of the pedestal supports/electrodes shown.

Figure 4:
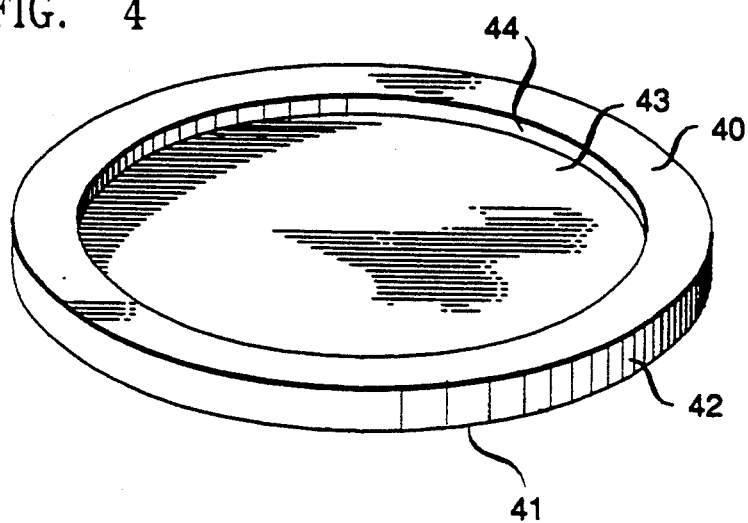

FIG. 4 depicts a cavity configuration physically differing but functionally similar to that of FIG. 1. Critical spacing to accommodate the whispering modes, common to all embodiments of the invention, is that between surfaces 40 and 41, in this instance defining a smooth curved edge surface 42. Likely of little device-function significance, although possibly involved in pumping—e.g. electrical or optical, membrane 43 may serve for physical stabilization of the structure. Edge 44, together with a possible mating edge on the underside of membrane 43, will be elemental in mode selection—will be of influence in selection of a modal path of sufficient $M_1$ as to lessen energetically unfavored field penetration. This figure is intended as representative of flat-sided (polygonal) as well as curve-sided structures, both of regular or irregular configuration.

FIG. 5 is representative of a class of embodiments similar to that of FIG. 4 but depending upon modal path selection/containment within a perimeter region of varying thickness. The specific example shown depends upon a functional region 50 of generally circular cross-section as defined by surface 51. Again, structural rigidity is afforded by membrane 52 forming a continuum within the enclosed portion of region 50. Dimension 53 is relevant, e.g. from the standpoint of confinement, consistent with the inventive thrust—for a preferred embodiment is $\approx \lambda/4n_{\it eff}$. Again, as in FIG. 4, the lateral dimension of region 50 is determinative of mode selection and, if of sub-wavelength dimension as discussed, may additionally offer useful confinement as well.

Figure 6:
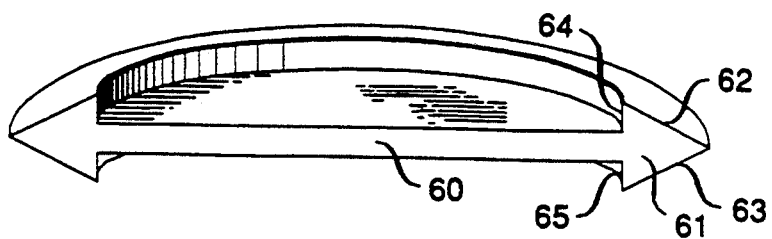

FIG. 6 depicts a configuration alternative to FIG. 5. It depends upon a membrane 60 for stabilization of a modal path region 61 of cross section defined by surfaces 62–65. As with other configurations depicted, the category represented may be of regular or irregular shape, may be defined by curved or faceted surfaces. The particular triangular cross-section shown is usefully employed for more specific mode selection for given dimensions.

Figure 8:
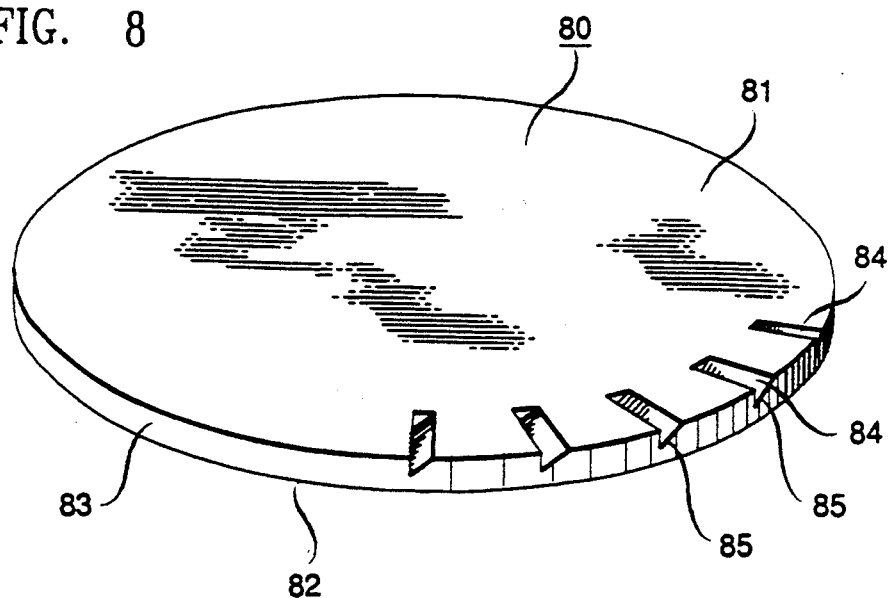
FIG. 8 is a perspective view of a structure providing for out-of-plane emission as resulting from grouped notches imposed in the peripheral mode path.

While a significant advantage of the inventive approach as compared with that of the SEL involves in-plane emission to facilitate coupling with other elements of an IC, it is useful to provide for out-of-plane emission as well. FIG. 8 depicts a disk 80 defined by planar surfaces 81 and 82 within circular perimeter 83. Grooves 84 are designed to couple a part of cavitating energy, not shown out-of-plane. In this version, whispering mode structures of the invention may serve in the manner of the familiar SEL, for example, in chip-to-chip communication. For cavitating energy in a clockwise direction, out-of-plane direction is determined by the angle of groove sides 85 as coupled with index contrast. In an alternative approach, counter clockwise cavitation may result in out-of-plane emission by virtue of simple reflectivity of groove surfaces 85—perhaps as effected by use of mirror layer/s, not shown.

Figure 9:
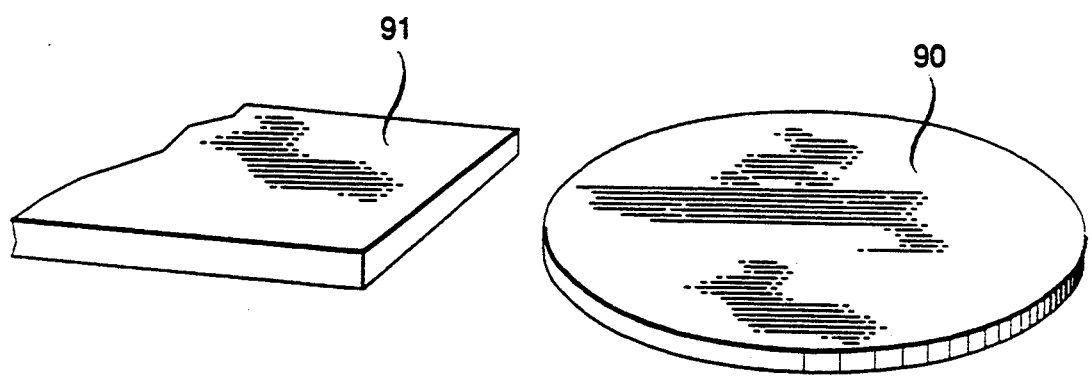
FIG. 9, again a perspective view, illustrates coupling-extraction of in-plane emission.

FIG. 9 depicts a disk structure 90 in proximity with path member 91, so positioned and of such interspacing as to provide for in-plane coupling. Experimental work including that reported in Examples 1 and 2 has involved light pumping. A number of considerations including ease of fabrication dictate this approach, and it is likely that it will continue to define an area of consequence. On the other hand, the inventive principle, in being generically based, upon whispering mode operation in critically thin structures, is not so limited. Principle of operation is applicable to the various pump arrangements that have been found or may be found functional. For many purposes, direct electrical pumping continues to be desirable—may justify fabrication complications which are aggravated at the small dimensions contemplated.

FIGS. 10 and 11 depict electrically pumped lasers otherwise in accordance with the foregoing. In FIG. 10 the disk structure 100, which may take any of the forms described, may be regarded as electrically pumped by means of straddling electrodes 101 and 102 shown as biased via circuit 103 as powered by power source 104. Alternatively, element 104 may be an element permitting operation as a detector. Simplistically, this element 104 may be a current meter responsive to the emf developed across straddling electrodes 101 and 102 by virtue of cavitating energy responsive to pumping—e.g. responsive to light pumping. In this use detection may take the form of that described in Example 4 which makes use of the alternate structure of FIG. 11. This structural approach may find favor in that the electrodes may serve as physical support for one or both sides of disk 100. Either or both of the embracing electrodes 101 and 102 may be formed by selective etching from a growth substrate as discussed in fabrication of pedestal 73 of the structure of FIG. 7. Addition of dopant, e.g., to the InP—likely into the entirety before etch-definition—may be desirable to lessen series resistance. Since now forming a junction—likely a pn junction—conductivity-imparting dopant will be significant dopant, in one instance, n-type; in the other, p-type. Specific design parameters with a view to electrical pumping are not properly within the province of this description and are well known.

FIG. 11, operating as an electrically pumped disk structure 110 is alternative to that of FIG. 10. In this arrangement, positive and negative electrodes 111 and 112, respectively, powered by dc current source 113, via leads 114, are affixed to a common plane 115 of disk 110. Spacing and, more generally, positioning of electrodes 111 and 112 are such as to provide for a peripheral cavitation path of desirable independence of the electrodes and, if surface is of roughness to result in performance-significant, unwanted scattering, of peripheral surface 116. Regardless of configuration—whether smooth or faceted-design optimization may result in a disk 110 of a greater major dimension in the direction defined by the electrodes. The resulting oval or irregular polygonal configuration may better provide for lessening of unwanted coupling between cavitating energy and the electrodes. Alternatively, such electrode/s may serve as well for coupling of emitting energy.

Operating as a detector, element 113 is a current meter or other device sensitive to voltage developed across electrodes 111 and 112. Examples 4 and 5 concern use as a detector—as a two-port, simple cavity-enhanced detector, and as a three-port light pumped amplifying detector, respectively.

Other Considerations

The invention has been described in terms sufficient to those of requisite skill in the art. Experimentally observed design/material implications have been set forth where relevant to matters under discussion. Additional observations are briefly noted.

It has not been considered appropriate to exhaustively describe presently available suitable active materials. In general, material choice is with regard to the same considerations as applied to earlier laser structures. Choice is accordingly on the basis of desired wavelength of operation with a view to a variety of other matters, most importantly with regard to fabrication.

Selected pump power may serve to favor a particular desired mode. In certain experiments, for example, it was found that decreasing pump power in a device operating above lasing threshold often resulted in mode switching—in the instance of 5 μm diameter disks, in switching by 0.06 μm. This observation, usable for optical laser use, is consistent with a whispering mode having a modal number M ≈38. The lowest loss modes for this structure appear to have a radial mode number N ≈4. The mode so defined has a maximum energy modal path which is sufficiently separated from the outer edge to lessen loss due to surface scattering. In addition separation from the pedestal is sufficient to prevent significant unwanted coupling. In this connection, it has been observed, as expected, that coupling, and therefore surface emission, emanates from the two points of the rhombus-shaped pedestal most distant from the center of the disk.

I claim:

1. Apparatus comprising at least one element providing for cavitation of electromagnetic energy with cavitation being primarily dependent upon whispering gallery modes in accordance with which modal path is defined within a body of high refractive index for such energy relative to refractive index of surrounding ambient at an interface between such body and ambient, such path being polygonal and of at least three sides with retention being primarily due to incidence of cavitating wave energy at or below the critical angle defined at such interface Characterized in that the said element, at least over a region corresponding with a substantial portion of such cavitation path, has a dimension of a maximum of $\lambda/2n_{eff}$ as measured in a direction normal to the plane of the path, in which $\lambda$ is the wavelength of cavitating energy as measured in a vacuum and $n_{eff}$ is the actual refractive index for such cavitating energy, such value accounting both for variation in bulk index for the medium of the body and for such variation on such bulk index as is introduced due to constraining surfaces, and in which such interface is of refractive index contrast for cavitating energy which is numerically equal to at least 1.5, such value yielded by the fraction $n_{eff}/n_s$ in which $n_{eff}$ is the effective refractive index for cavitating energy within the said body and $n_s$ is the refractive index for such energy outside the defining interface of such body.

2. Apparatus of claim 1 in which said at least one element provides for electromagnetic emission of the wavelength and phase character of cavitation energy 3. Apparatus of claim 2 in which the said normal dimension approximates the value $\lambda/4n_{eff}$.

4. Apparatus of claim 2 in which a substantial portion of such cavitation path is within a region in the said body defined by plane parallel flat interfaces.

5. Apparatus of claim 2 in which such cavitation path is within a peripheral region of the said body and in which such peripheral region encloses an inner region which is substantially thinner than the said normal dimension.

6. Apparatus of claim 2 in which the said element is of maximum dimension of the order of microns.

7. Apparatus of claim 2 in which such element designedly attains lasing threshold in operation.

8. Apparatus of any of claims 1–7 in which the said cavitational path defines a polygon of at least four sides.

9. Apparatus of claim 2 together with means for coupling emitted energy.

10. Apparatus of claim 9 in which such means provide for in-plane coupling.

11. Apparatus of claim 10 in which coupling includes a gap intermediate said element and the defined emission path.

12. Apparatus of claim 9 in which such means provides for out-of-plane coupling.

13. Apparatus of claim 12 in which such means entails at least one physical groove on a lateral surface of said body.

14. Apparatus of claim 13 in which such means entails a plurality of such grooves.

15. Apparatus of claim 2 comprising an integrated circuit.

16. Apparatus of claim 15 in which said integrated circuit includes a plurality of said elements.

17. Apparatus of claim 16 in which said integrated circuit is optoelectric.

18. Apparatus of claim 17 in which said integrated circuit includes means for pumping said elements.

19. Apparatus of claim 18 in which said means is optical and is provided by a laser pump.

20. Apparatus of claim 1 in which said at least one element constitutes a three port device, the first port providing for input pump energy, the second port providing for exiting output energy, and the third port providing for variation in some property of the output energy.

21. Apparatus of claim 20 in which such property is time-dependent elimination of output energy so resulting in intervals between output energy pulses.

22. Apparatus of claim 20 in which such property is exiting direction.

23. Apparatus of claim 20 in which such property is variation in amplitude.

24. Apparatus of claim 20 in which such property is variation in phase.

25. Apparatus of claim 1 in which said at least one element provides for electromagnetic input, a substantial part of which is of frequency and polarization to satisfy cavitation requirements.

26. Apparatus of claim 25 in which said at least one element is a detector.

27. Apparatus of claim 26 in which said at least one element provides for electrical output.

* * * * *